US005663654A

United States Patent [19]
Wood et al.

[11] Patent Number: 5,663,654
[45] Date of Patent: Sep. 2, 1997

[54] UNIVERSAL WAFER CARRIER FOR WAFER LEVEL DIE BURN-IN

[75] Inventors: Alan G. Wood; Tim J. Corbett, both of Boise; Warren M. Farnworth, Nampa, all of Id.

[73] Assignee: Micron Technology, Inc., Boise, Id.

[21] Appl. No.: 643,516

[22] Filed: May 6, 1996

Related U.S. Application Data

[63] Continuation of Ser. No. 981,956, Nov. 24, 1992, Pat. No. 5,539,324, which is a continuation-in-part of Ser. No. 575,470, Aug. 29, 1990, abandoned.

[51] Int. Cl.⁶ ........................................... G01R 31/28
[52] U.S. Cl. .............................. 324/758; 324/760; 439/66
[58] Field of Search ........................ 324/758, 73.1, 324/760, 754, 755, 756, 757; 29/842; 439/66, 68, 91

[56] References Cited

U.S. PATENT DOCUMENTS 5,034,685  7/1991  Leedy ............................... 324/73.1

*Primary Examiner*—Ernest F. Karlsen
*Assistant Examiner*—Barry C. Bowser
*Attorney, Agent, or Firm*—Trask, Britt & Rossa

[57] ABSTRACT

A reusable burn-in/test fixture for testing unsingulated dice on a semiconductor wafer consists of two halves. The first half of the test fixture is a die cavity plate for receiving the wafer, and the second half establishes electrical communication between the wafer and electrical test equipment. A rigid substrate has conductors thereon which establish electrical contact with the wafer. The test fixture need not be opened until the burn-in and electrical test are completed. After burn-in stress and electrical test, it is possible to establish interconnection between the single dice or separate and package the dice into discrete parts, arrays or clusters, either as singulated parts or as arrays.

33 Claims, 4 Drawing Sheets

UNIVERSAL WAFER CARRIER FOR WAFER LEVEL DIE BURN-IN

CROSS-REFERENCE TO RELATED APPLICATIONS

This application is a continuation of application Ser. No. 07/981,956, filed Nov. 24, 1992, now U.S. Pat. No. 5,539,324 which is a continuation-in-part of application Ser. No. 575,470 filed Aug. 29, 1990, abandoned.

FIELD OF THE INVENTION

This invention relates to electrical test equipment for semiconductor devices. More specifically, the invention relates to an apparatus and method to perform dynamic burn-in and full electrical/performance/speed testing on an array of semiconductor dice on a wafer.

BACKGROUND OF THE INVENTION

Semiconductor devices are subjected to a series of test procedures in order to confirm functionality and yield, and to assure quality and reliability. This testing procedure conventionally includes "probe testing", in which individual dice, while still on a wafer, are initially tested to determine functionality and speed. Probe cards are used to electrically test die at that level. The electrical connection interfaces with only a single die at a time in wafer, before the dice are singulated from wafer.

If the wafer has a yield of functional dice which indicates that quality of the functional dice is likely to be good, each individual die is traditionally assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (devices under test or DUT) at elevated temperatures, elevated dynamic biasing schemes. This induces infant mortality failure mechanisms and elicit potential failures which would not otherwise be apparent at nominal test conditions.

Variations on these procedures permit devices assembled onto circuit arrangements, such as memory boards, to be burned-in, along with the memory board in order to assure reliability of the circuit board and the circuit board assembly and manufacturing process, as populated with devices. This closed assembly testing assumes that the devices are discretely packaged in order that it can then be performed more readily.

Semiconductor packaging has been referred to in terms of "levels" of packaging. The chip capsule generally constitutes a first level of packaging. A second level would then be a "card" or a printed circuit board. A third level may include second level packaging combined with a motherboard. A fourth level may follow the third level. In each case, the packaging to any level involves cost.

It is proposed that devices be packaged without conventional lead frames. This creates two problems for being conventional test methods. Firstly, discrete testing is more difficult because the conventional lead frame package is not used. Furthermore, multiple device may be assembled into a single package, thereby reducing the performance of the package to that of the die with the lowest performance. This is because the ability to presort the individual dice is limited that obtained through probe testing. Secondly, the packaging may have other limitations package assembly defect mechanisms which are aggravated by burn-in stress conditions so that the packaging becomes a limitation for burn-in testing.

According to the invention represented by U.S. Pat. No. 4,899,107, to Alan Wood and Tim Corbett, a reusable burn-in/test fixture for discrete die is provided. The fixture consists of two halves, one of which is a die cavity plate for receiving semiconductor dice as the devices under test (DUT); and the other half establishes electrical contact with the dice and with a burn-in oven.

The first half of the test fixture contains cavities in which die are inserted circuit side up. The die will rest on a floating platform. A support mechanism under the die platform will provide a constant uniform pressure or force to maintain adequate electrical contact to the die contacts on the DUT to probe tips on the second half. The support mechanism will compensate for variations of overall die thickness.

The second half has a rigid high temperature rated substrate, on which are mounted probes for each corresponding die pad. Each probe is connected to an electrical trace on the substrate (similar to a P.C. board) so that each die pad of each die is electrically isolated from one another for high speed functional testing purposes. The probe tips are planar so that contact to each die pad occurs simultaneously. The probe tips are arranged in an array to accommodate eight or more dice. The traces from the probes terminate in edge fingers to accept a conventional card edge connector. The geometry of the probes and edge fingers are optimized to avoid electrical test artifacts.

The two halves of the test fixture are joined so that each pad on each die aligns with a corresponding electrical contact. The test fixture is configured to house groups of 8 or 16 die for maximum through put efficiency of the functional testers. The test fixture need not be opened until the burn-in and electrical test are completed. After burn-in stress and electrical test, the die are removed from the test fixture and depositioned accordingly. The fully burned-in and tested die are available for any type of subsequent assembly applications.

That technique allows all elements of the burn-in/test fixture to 100% reusable, while permitting testing of individual dice in a manner similar to that accomplished with discrete packaged semiconductor devices.

An ability to extend accelerated burn-in and functional/parametric/speed testing of dice to include accelerated burn-in and functional, parametric and speed testing while the dice are still on the wafer would have several advantages. Since each step in the assembly and package process represents commitment of resources, early determination of defective parts or ability to predict a failure at a conventional burn-in stage is advantageous. It would be further advantageous to be able to predict a failure at a burn-in stage prior to assembly. Clearly, if a part can be made to fail prior to assembly, assembly resources can be directed to a higher percentage of good parts.

There exists a significant market for uncut fabricated wafers. These wafers are referred to as "probe wafers" because they are delivered after probe testing, which follows fabrication. The purchase of probe wafers is primarily by "ASIC assembly houses" which custom package parts, including parts traditionally considered to be "commodity" chips. The purchase of uncut wafers is usually based on the recent yield rate of the semiconductor manufacturer, but recent yields are not a strong indicator of the yield of any given wafer lot. Furthermore, the assembly process techniques used by the assembly house have a significant effect on yield.

Characterization, such as speed grading is even more variable than yield. While a packaged DRAM is purchased by the consumer based on the part's speed grade, speed grading of probe wafers is almost a matter of conjecture. That means that it is happenchance as to whether the assembly house purchases a wafer of mostly "–10" parts (100 ns) or mostly "–6" parts (60 ns).

Recent developments in fabrication technology have resulted in such speed characterizations being more uniform on any given wafer. This has made it possible to provide wafers in which a majority of good dice have speed grades which do not greatly exceed an average for the wafer. Such uniformity, along with an ability to achieve fuse repairs and patches, have made wafer scale integration of arrays and cluster packaging practical.

Other developments include an ability to track individual dice on wafers, starting at probe. Traditionally, probe identifies bad dice, (example, an ink spot.) The assembly process is continued only for dice which do not have the ink spots. By computer tracking, the ink spot becomes superfluous, as a map of good and bad dice are stored and transferred to subsequent assembly steps.

Although the dice are singulated, there are cases in which the discrete parts are reassembled into an array after assembly. An example is in computer memory, in which one or more banks of memory are composed of arrays of memory chips. It would be advantageous to be able to select good dice on a wafer and assemble the dice into an array without singulating the dice. This would allow a much denser array of good clustered dice on a single piece of silicon.

It is an object of the invention to increase handling efficiency, while at the same time reducing the required size of the test fixture.

SUMMARY OF THE INVENTION

According to the present invention, burn-in and testing is accomplished on an uncut wafer by mounting the wafer to a reusable burn-in/test fixture. The test fixture has contact tips thereon in order that electrical contact may be established for individual dice on the wafer. The fixture consists of two halves, one of which is a wafer cavity plate for receiving the wafer as the devices under test (DUT); and the other half establishes electrical contact with the wafer and with a burn-in oven.

The first half of the test fixture contains a cavity in which the wafer is inserted. The wafer will rest in the cavity, and a platform on the second half applies pressure to the fixture half which establishes electrical contact. In the preferred embodiment, a support mechanism under the platform will provide a constant uniform pressure or force to maintain adequate electrical contact to the die contacts on the DUT to contact tips on the second half. The support mechanism can include pneumatic-mechanical, elastomeric, or any other appropriate biasing mechanism.

The contact tips are electrical contact locations at which the electrical contact is established by the fixture. These may be flat contact areas which mate with bumps on the wafer, raised electrical bumps or resilient fingers. The wafer itself may use either flat bond pads or raised bump contacts.

According to one embodiment, a TAB interconnect circuit is used for the electrical contact locations. After burn in, it is possible to either retain the TAB interconnect circuit on the completed circuit, or remove the TAB interconnect circuit after testing. If the TAB interconnect circuit is retained, the final interconnect pattern of the wafer would be modified as necessary after testing.

The second half has a rigid high temperature rated substrate, on which are mounted conductive electrical contacts or pads for each corresponding die on the wafer. Each contact (example: probe) is connected to an electrical trace on the substrate (similar to a P.C. board) so that each die pad of each die is electrically isolated from one another for high speed functional testing purposes. The contact tips are planar so that contact to each die pad occurs simultaneously. The traces from the probes terminate in edge fingers to accept a conventional card edge connector. The geometry of the contact tips and edge fingers are optimized to avoid electrical test artifacts.

The two halves of the test fixture are joined so that each pad on each die on the wafer aligns with a corresponding electrical contact tip. The test fixture need not be opened until the burn-in and electrical test are completed. After burn-in stress and electrical test, the wafer is removed from the test fixture and may be singulated or interconnected as desired. The fully burned-in and tested die wafer is then available for a variety of end use applications which require high yielding and high reliability semiconductors. The resulting dice are available for any type of subsequent assembly/packaging applications.

In configurations in which wafer scale integration are used, circuits connect the dice according to circuit array protocols, and these circuits are selectively severed in order to provide a functional array. Once the functional cluster or arrays (good dice) have been tested for functionality and speed, and have been burned in, they are then diced accordingly. Diced clusters or arrays of dice can then be densely packaged utilizing various interconnect technologies, for example; wirebond, ribbon, TAB, tape, or conductive elastomer.

That technique allows most or all elements of the burn-in/test fixture to be 100% reusable, while permitting testing of individual dice while on the wafer in a manner similar to that accomplished with discrete packaged semiconductor devices.

The invention is able to increase handling efficiency by performing test and burn in functions at the wafer level, while at the same time reducing the required size of the test fixture.

DETAILED DESCRIPTION OF THE PREFERRED EMBODIMENT

Figure 1A:
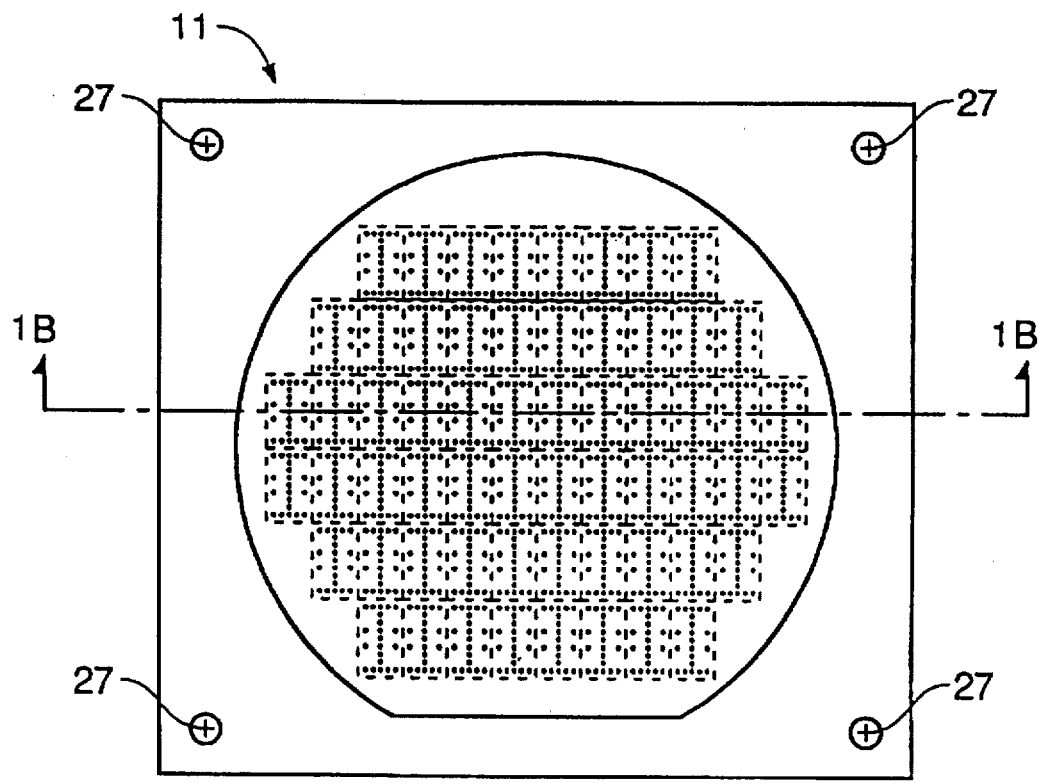
FIG. 1 shows the inventive wafer cavity plate.
Figure 1B:
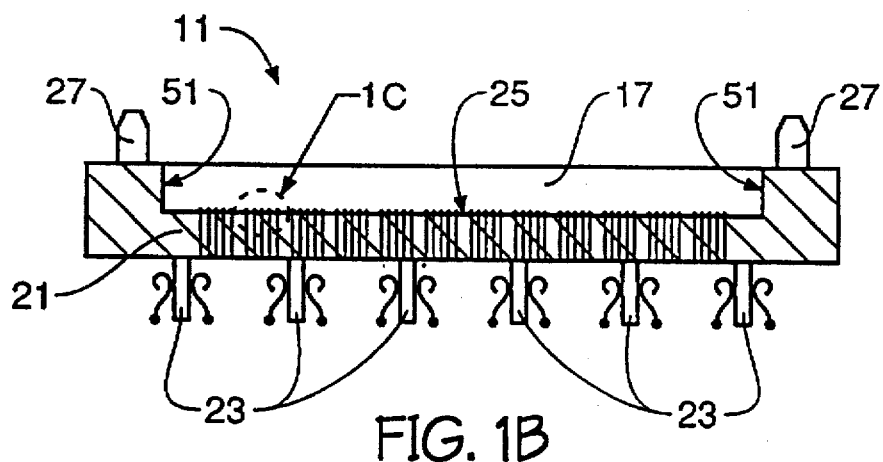
Figure 1C:
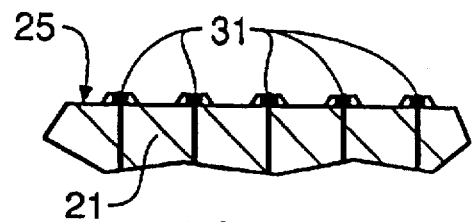
Figure 2A:
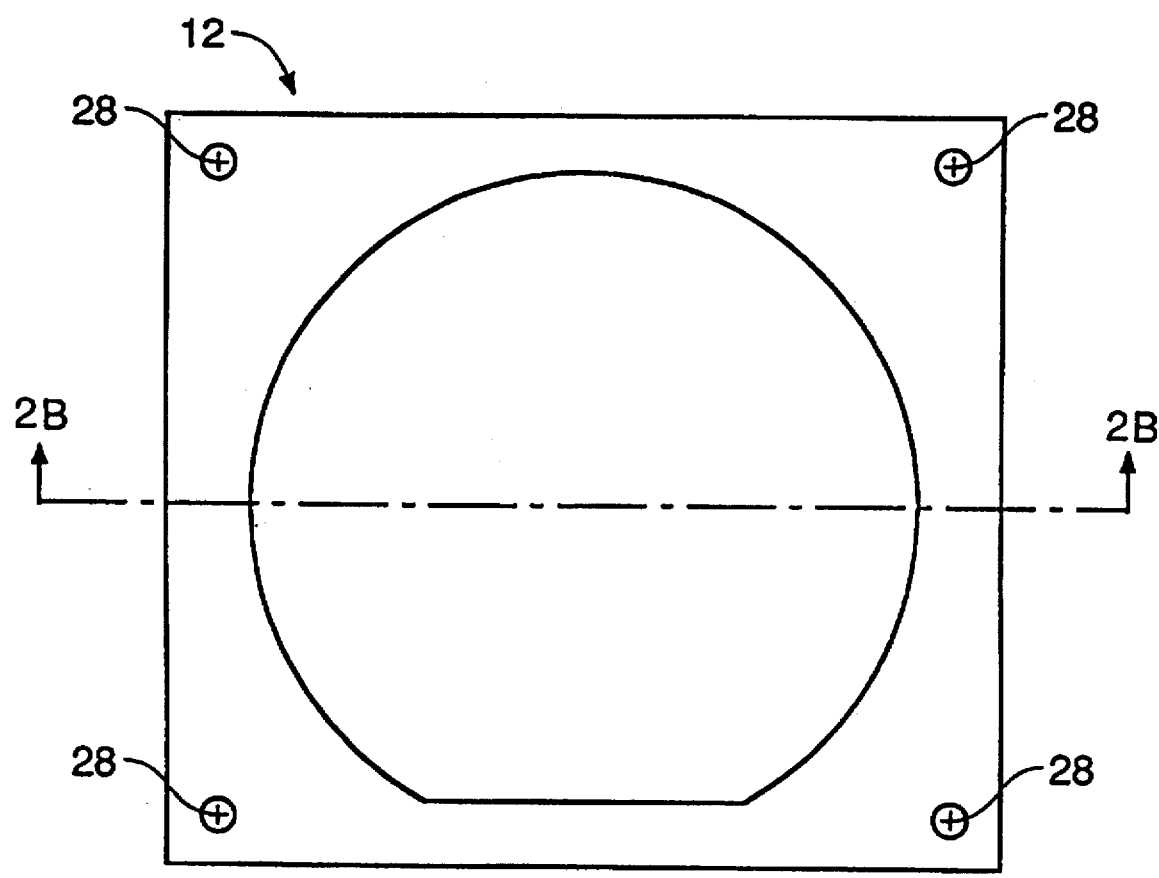
FIGS. 2B show a support plate used in association with the wafer cavity plate of FIG. 1.
Figure 2B:
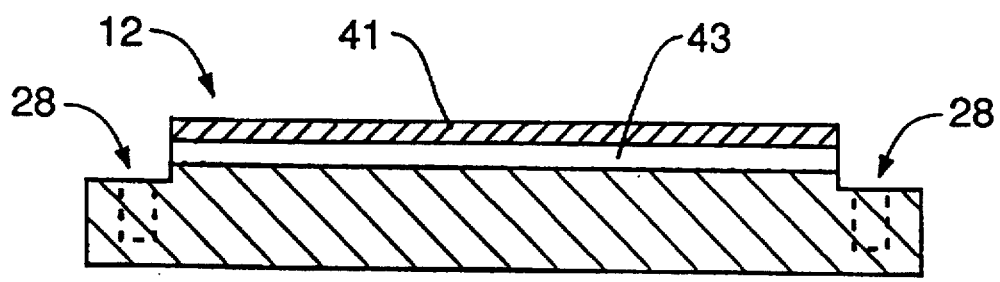

Referring to FIGS. 1 and 2, the inventive burn-in fixture includes a wafer cavity plate 11, shown in FIG. 1, and a support plate 12 shown in FIG. 2. The wafer cavity plate 11 includes a wafer receiving cavity 17, which is dimensioned to receive a semiconductor wafer.

Figure 3:
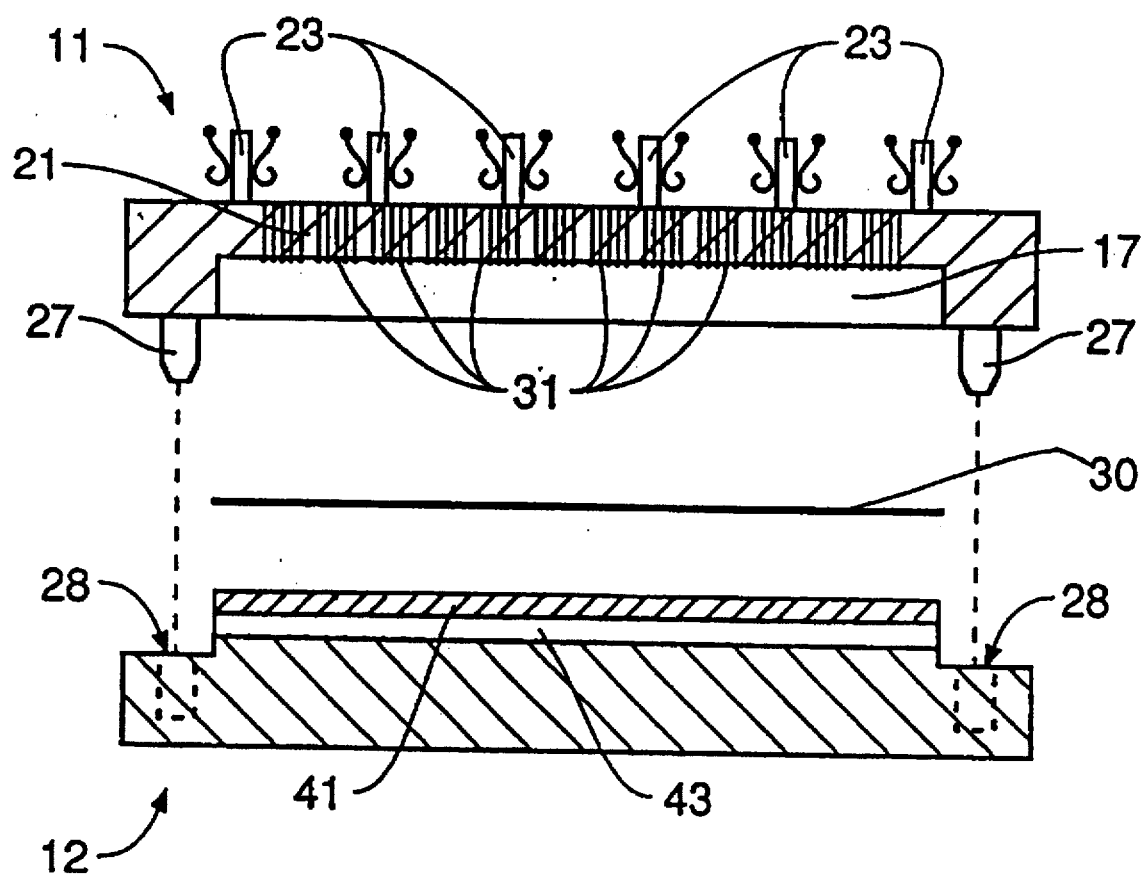
FIG. 3 shows the alignment of the plates of FIGS. 1 and 2.

The wafer cavity plate 11 includes a main plate portion 21, from which extends a plurality of edge provisions for electrical communication connectors 23. It is possible to use other provisions for electrical communication instead of the edge connectors 23. The wafer cavity plate 11 aligns with the support plate 12 so that a bottom surface 25 of the main plate portion 21 aligns with the wafer receiving cavity 17 on the wafer cavity plate 11. Alignment devices, such as dowels 27 and dowel-receiving cavities 28 are used to establish an alignment of the support plate 12 with the wafer cavity plate 11. The alignment of the plates 11, 12 is shown in FIG. 3, in which a wafer 30 is shown between the plates 11, 12.

In the preferred embodiment, a probe plate is fabricated on a substrate 63 ( FIG. 4 ) and has conductive patterns therein. The conductive patterns terminate in conductive bumps (for example) or pads. It is also possible to form the substrate 63 so that it is thin enough to be at least partially flexible. By way of example, such a partially substrate 63 may be formed from silicon or ceramic which has been made thin enough that it is able to be flexed substantially more than the wafer 30. Circuit traces on the substrate 63 communicate with individual contacts on the edge connectors 23'. This permits the edge connectors 23' to be used to connect the contact pads on the dice with external electrical equipment (not shown). While the edge connectors 23' are shown as being generally aligned with the individual dies on the wafer, it is possible to have the circuit traces extend to any convenient location on the substrate 63.

Alternatively, by making the substrate thin enough, or by using a flexible material, it is possible to use a flexible substrate, which is by its nature more likely to conform to the wafer 30. This flexible substrate can be combined with a rigid support (not shown) to make the substrate semi-rigid.

A form of TAB technique may be used in order to connect the wafer to external circuitry. (External circuitry can be any circuit to which the wafer 30 is connected, usually test equipment or burn-in equipment.) The particular TAB technique used is a temporary bonding of wafer contact pads to a TAB circuit. The TAB circuit is temporarily bonded in order to provide burn-in and test capability, but to allow the TAB circuit to be removed subsequent to the burn-in and test procedure.

The TAB circuit is connected to the edge connectors 23 in order to permit the dice on the wafer 30 to be connected to the external circuitry. The TAB circuit may then be modified in order to accommodate the test results or removed from the wafer 30.

Since the wafer 30 is tested prior to being divided into individual dice, it is possible to provide interconnects between the dice on the wafer 30. This would make it somewhat easier to connect to each die, without having to establish a contact pin location for each individual die. In the case of memory chips, address circuitry can easily be provided on the wafer 30, since the process for manufacturing the chips includes the provision of address circuitry. A similar type of circuit could be easily be produced simultaneously, except that this particular circuit addresses the dice, rather than portions of a die. The "on-board" driver circuitries would help simplify the need for the redundant I/O lines and could be discarded if not applicable in the end-use application.

The support plate 12 includes a floating platform 41 which is supported by a biasing mechanism 43. The wafer 30 is held in place in the wafer receiving cavity 17 by the floating platform 41. In the embodiment shown, the biasing mechanism 43 is an elastomeric polymer, although coil springs or the like can be used. The purpose of the biasing mechanism 43 is to bias the floating platform 41 upwards so that when the wafer 30 is inserted into the wafer receiving cavity 17 and the fixture is, assembled, the wafer will be in contact with the contact tips 31. The biasing force of the biasing mechanism 43 and the travel of the floating platform 41 must be uniform enough and provide enough travel that when the wafer receiving cavity 17 receives a wafer, and the support plate 12 is mounted to the wafer cavity plate 11, the contact tips 31 will each contact the die pads. As a result of the uniformity of travel and biasing, the mating of the wafer cavity plate 11 and the support plate 12 need only accommodate the need to provide an even biasing of the wafer 30 against the contact tips 31 to a degree sufficient for each contact tip 31 to contact its respective die pad. This means that lateral alignment, as established by the dowels 27 and holes 28 is more critical than the precise closeness of the support plate 12 to the wafer cavity plate 11.

In the example shown, a number of edge connectors 23 are shown, wherein the edge connector 23 is in optimum proximity to ends 51 of the wafer receiving cavity 17. Since the die pad are normally located at the ends 51, the edge connector 23 are in close proximity to the die pads, thereby resulting in a very short circuit length between the die pads and the edge connectors 23. Of course, it is possible to provide either fewer or more edge connectors 23 as is convenient for a design consideration. It is likely that a large number of edge connectors 23 will be provided because of the large number of contacts on each semiconductor die.

It is possible to use address circuitry in order to reduce the number of external connectors which would be otherwise necessary in order to perform complete testing of the circuits on the wafer 30. In this manner, an entire wafer can be tested with a small number of connections. An example of an appropriate address circuit would be an address and self test circuit arrangement used on a computer memory board.

The assembled fixture is adapted into conventional test equipment, such as a burn-in oven. In case of a burn-in oven, it may be desirable to connect the edge connectors to a burn-in circuit, in which common connectors are used for the multiple devices. In any case, it is possible to use the edge connectors 23 to connect the die in a test fixture to existing discrete apparatus (not shown).

Figure 4:
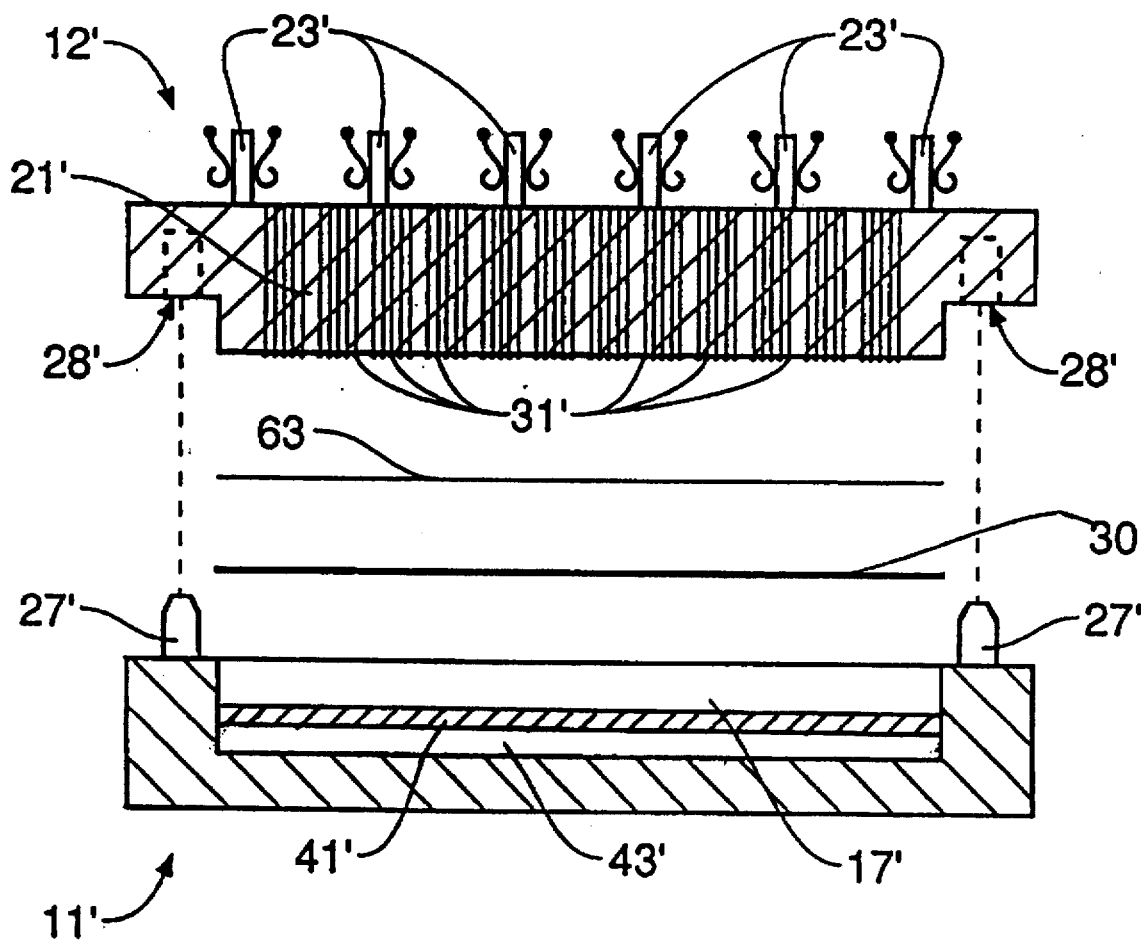
FIG. 4 shows and alternate embodiment of the invention, in which probe contacts are located on the support plate.

In an alternate embodiment, shown in FIG. 4, a bottom surface of the support plate 12' has a number of contact tips 31' extending therefrom. The contact tips 31' are sufficiently flexible to compensate for variations in die pad height. The contact tips 31' align with the wafer receiving cavity 17' in a manner which, when a wafer is located in the wafer receiving cavity 17' the contact tips 31' electrically communicate with individual contact pads on the dice. The substrate 63 can be formed an elastomeric mat interposed between the wafer 30 and the support plate 12'. This configuration would appear as shown in FIG. 4, with substrate 63 being the elastomeric mat. The elastomeric mat would conduct in patterns corresponding to the conductive bumps or pads on the contact areas of the wafer 30 in order to provide positive electrical contact between the support plate 12' and the wafer 30.

In the alternate embodiment, the main plate portion of 21' of the support plate 12' includes a series of circuit traces (not shown). The circuit traces communicate with individual contacts on the edge connectors 23'. This permits the edge connectors 23' to be used to connect the contact pads on the dice with external electrical equipment (not shown).

What has been described is a very specific configuration of a test fixture. Clearly, modification to the existing apparatus can be made within the scope of the invention. Accordingly, the invention should be read only as limited by the claims.

We claim:

1. An apparatus for testing an array of semiconductor dice located on a wafer, said wafer having, in turn, a first side having said array located thereon and a second side, comprising:

a first support member configured to receive said array of semiconductor dice located on a wafer in a predetermined orientation, said first support member including:
  a biasing assembly located thereon, said biasing assembly configured to bias said array of semiconductor dice located on a wafer in a first direction when the biasing assembly engages said second side of said wafer;
  a second support member configured to receive said array of semiconductor dice located on said first side of said wafer therein and to selectively engage said first support member to retain said array of semiconductor dice located on a wafer therebetween; and
  a substrate including:
    electrical traces sized and oriented to establish electrical contact with said array of semiconductor dice located on said first side of said wafer, said substrate retained proximate said array of semiconductor dice located on said first side of said wafer by said first support member engaging a portion of said second support member and biased against said array of semiconductor dice located on said first side of said wafer by said biasing assembly located on said first support member engaging said second side of said wafer.

2. The apparatus as claimed in claim 1 and wherein said array of semiconductor dice located on a wafer comprises an entire array of semiconductor dice located on a first side of said wafer.

3. The apparatus as claimed in claim 1 and further comprising a plurality of contact tips formed on the second support member to contact said electrical traces on said substrate to establish electrical communication with contact locations on said dice.

4. The apparatus as claimed in claim 1 and further comprising a plurality of electrical connectors formed on the second support member in electrical communication with contact tips formed on the second support member to contact said electrical traces on said substrate to establish electrical communication with contact locations on said dice.

5. The apparatus as claimed in claim 1 and wherein said first support member comprises a plate in contact with an elastomeric polymer.

6. The apparatus as claimed in claim 1 and wherein said second support member comprises a plate formed having a cavity therein and having electrical connectors configured to establish electrical communication with test circuitry and to establish electrical communication with the electrical traces of said substrate.

7. The apparatus as claimed in claim 1 and further comprising aligning devices for aligning said first support member with said second support member.

8. The apparatus as claimed in claim 1 and wherein said substrate is formed of silicon.

9. The apparatus as claimed in claim 1 and wherein said substrate is flexible.

10. An apparatus for testing an array of semiconductor dice located on a wafer, said wafer having, in turn, a fist side having said array located thereon and a second side, comprising:
  a first support member and a second support member configured to receive said array of semiconductor dice located on a wafer therebetween;
  a plurality of contact members formed on the first support member;
  a biasing assembly formed on the second support member and configured to bias the array of semiconductor dice located on a wafer towards the plurality of contact members formed on the first support member, the biasing assembly contacting said second side of said wafer; and
  a substrate placed in contact with said array of semiconductor dice located on said first side of said wafer and the contact members formed on the first support member, the substrate comprising:
    electrical traces sized and oriented to establish electrical communication between the contact members formed on the first support member and contacting locations on said array of semiconductor dice located on said first side of said wafer.

11. The apparatus as claimed in claim 9 and further comprising an alignment device for aligning the first and second support member.

12. The apparatus as claimed in claim 9 and wherein the substrate is flexible.

13. The apparatus as claimed in claim 9 and wherein the substrate comprises silicon.

14. The apparatus as claimed in claim 9 and wherein the electrical traces on the substrate are formed of TAB tape.

15. The apparatus as claimed in claim 10 and wherein the biasing assembly comprises a plate for supporting the array of semiconductor dice located on a wafer, the plate contacting said second side of said wafer, and an elastomer material sandwiched between the plate and the second support member.

16. The apparatus as claimed in claim 9 and wherein the array of dice comprises an entire semiconductor wafer.

17. An apparatus for testing a semiconductor wafer having an array of semiconductor dice formed on the first side thereof and a second side, comprising:
  a first support member having a biasing assembly for supporting the wafer located thereon, the biasing assembly contacting said second side of said wafer;
  a second support member having a plurality of contact members thereon in electrical communication with electrical connectors, said second support member configured for mating engagement with said first support member; and
  a flexible substrate placed between said first and second support members, said flexible substrate biased into contact with said array of semiconductor devices formed on said first side of said wafer and biased into contact with the contact members of said second support member by said biasing assembly contacting said second side of said wafer, said flexible substrate including:
    electrical traces configured to establish electrical communication between the contact members on the second support member and contact locations on the said array of semiconductor dice located on said first side of said wafer.

18. The apparatus as claimed in claim 16 and wherein the electrical connectors on the second support member are configured for electrical connection to external test circuitry.

19. The apparatus as claimed in claim 16 and further comprising alignment devices formed on the first and second support members for alignment thereof.

20. The apparatus as claimed in claim 16 and wherein said biasing assembly comprises a plate and an elastomeric member on said first support member.

21. The apparatus as claimed in claim 17 and wherein said first support member includes a cavity for receiving a portion of said biasing assembly therein.

22. A method for testing an array of semiconductor dice located on a semiconductor wafer having a first side having, in turn, said array of semiconductor dice located thereon and having a second side, said method comprising:

provding a first plate, said first plate configured to receive said second side of said wafer in a desired orientation thereon;

providing a second plate, said second plate selectively engageable with said first plate, said second plate formed having a cavity therein to receive a portion of said first plate therein and having a plurality of contact elements extending therefrom;

placing a substrate between said wafer and said contact elements extending from said second plate, said substrate comprising a pattern of electrical members configured for establishing electrical communication between the contact elements on the first plate and corresponding contact locations of said array of semiconductor dice located on said first side of said wafer; and attaching said first plate to said second plate.

23. The method as claimed in claim 22 and further comprising biasing the wafer against the substrate.

24. The method as claimed in claim 22 and further comprising biasing the wafer against the substrate using a third plate mounted to the first plate with an elastomeric material therebetween.

25. The method as claimed in claim 22 and wherein the substrate is formed of a flexible material.

26. The method as claimed in claim 22 and wherein the substrate is formed of silicon.

27. The method as claimed in claim 22 and wherein the wafer comprises an entire semiconductor wafer.

28. The method as claimed in claim 22 and wherein said pattern of electrical members comprises TAB tape.

29. The method as claimed in claim 22 and further comprising aligning said first plate with said second plate.

30. A method for establishing electrical communication with an array of semiconductor dice located on a wafer, said wafer having a first side with said array of semiconductor dice thereon and a second side, said method, comprising:

providing an apparatus for receiving said array of semiconductor dice, said apparatus including a plurality of contact members formed thereon;

providing a substrate for placement in said apparatus between said contact members and said array of semiconductor dice formed on said first side of said wafer, said substrate comprising electrical members adapted to establish electrical communication between the contact members on the apparatus and corresponding contact locations on said array of semiconductor dice located on said first side of said wafer;

placing said substrate and said array of semiconductor dice located on said first side of said wafer in said apparatus; and applying a force to said second side of said wafer thereby causing said array of semiconductor dice located on said first side of said wafer to be biased against the substrate and said substrate to be biased, in turn, against the contact members of said apparatus.

31. The method as claimed in claim 30 and wherein applying the force is with a biasing assembly formed on said apparatus.

32. The method as claimed in claim 31 and wherein said biasing assembly comprises a plate supported by an elastomeric member.

33. The method as claimed in claim 32 and wherein said substrate is flexible.

* * * * *